(12) United States Patent
Wang et al.

(10) Patent No.: US 7,795,160 B2
(45) Date of Patent: Sep. 14, 2010

(54) ALD OF METAL SILICATE FILMS

(75) Inventors: Chang-gong Wang, Chandler, AZ (US);
Eric J. Shero, Phoenix, AZ (US); Glen Wilk, Scottsdale, AZ (US); Jan Willem Maes, Wilrijk (BE)

(73) Assignee: ASM America Inc., Phoenix, AZ (US)

( * ) Notice: Subject to any disclaimer, the term of this patent is extended or adjusted under 35 U.S.C. 154(b) by 56 days.

(21) Appl. No.: 11/490,875

(22) Filed: Jul. 21, 2006

(65) Prior Publication Data
US 2008/0020593 A1    Jan. 24, 2008

(51) Int. Cl.
    *H01L 21/31* (2006.01)
(52) U.S. Cl. .............................. 438/785; 257/E21.193; 257/E21.274
(58) Field of Classification Search ................. 438/785; 257/E21.194, E21.274
    See application file for complete search history.

(56) References Cited

U.S. PATENT DOCUMENTS

| | | | |
|---|---|---|---|
| 4,058,430 A | 11/1977 | Suntola et al. | |
| 5,187,241 A | 2/1993 | Buchwalter et al. | |
| 5,480,818 A | 1/1996 | Matsumoto et al. | |
| 5,496,582 A | 3/1996 | Mizutani | |
| 5,496,597 A | 3/1996 | Soininen et al. | |
| 5,505,991 A | 4/1996 | Schmid et al. | |
| 5,603,750 A | 2/1997 | Sierakowski et al. | |
| 5,711,811 A | 1/1998 | Suntola et al. | |
| 5,917,571 A | 6/1999 | Shimada | |
| 5,928,791 A | 7/1999 | Rosenmayer | |
| 5,972,430 A | 10/1999 | DiMeo et al. | |
| 6,006,763 A | 12/1999 | Mori et al. | |
| 6,090,442 A | 7/2000 | Klaus et al. | |
| 6,174,809 B1 | 1/2001 | Kang et al. | |
| 6,203,613 B1 | 3/2001 | Gates et al. | |
| 6,335,240 B1 | 1/2002 | Kim et al. | |
| 6,342,712 B1 | 1/2002 | Miki et al. | |
| 6,416,577 B1 | 7/2002 | Suntola et al. | |
| 6,492,528 B1 | 12/2002 | Matsuba et al. | |

(Continued)

FOREIGN PATENT DOCUMENTS

JP          53-148282          12/1978

(Continued)

OTHER PUBLICATIONS

U.S. Appl. No. 10/795,696, filed Mar. 3, 2004, Raaijmakers et al.

(Continued)

*Primary Examiner*—Alexander G Ghyka
*Assistant Examiner*—Seahvosh J Nikmanesh
(74) *Attorney, Agent, or Firm*—Knobbe Martens Olson & Bear LLP (57) ABSTRACT

Methods for forming metal silicate films are provided. The methods comprise contacting a substrate with alternating and sequential vapor phase pulses of a metal source chemical, a silicon source chemical and an oxidizing agent. In preferred embodiments, an alkyl amide metal compound and a silicon halide compound are used. Methods according to preferred embodiments can be used to form hafnium silicate and zirconium silicate films with substantially uniform film coverages on substrate surfaces comprising high aspect ratio features (e.g., vias and/or trenches).

31 Claims, 1 Drawing Sheet

U.S. PATENT DOCUMENTS

| | | | |
|---|---|---|---|
| 6,511,539 | B1 | 1/2003 | Raaijmakers |
| 6,537,613 | B1 | 3/2003 | Senzaki et al. |
| 6,613,383 | B1 | 9/2003 | George et al. |
| 6,780,476 | B2 | 8/2004 | Horikawa |
| 6,780,704 | B1 | 8/2004 | Raaijmakers et al. |
| 6,818,517 | B1 | 11/2004 | Maes |
| 6,831,315 | B2 | 12/2004 | Raaijmakers et al. |
| 6,835,417 | B2 | 12/2004 | Saenger et al. |
| 6,849,305 | B2 | 2/2005 | Bravo-Vasquez et al. |
| 6,858,546 | B2 | 2/2005 | Niinisto et al. |
| 7,045,170 | B1 | 5/2006 | Hankins et al. |
| 7,045,430 | B2 | 5/2006 | Ahn et al. |
| 2001/0024387 | A1* | 9/2001 | Raaijmakers et al. ........ 365/200 |
| 2003/0188682 | A1 | 10/2003 | Tois et al. |
| 2004/0043149 | A1 | 3/2004 | Gordon et al. |
| 2004/0065253 | A1 | 4/2004 | Tois et al. |
| 2004/0105935 | A1 | 6/2004 | Park et al. |
| 2004/0137678 | A1 | 7/2004 | Cho et al. |
| 2005/0070126 | A1* | 3/2005 | Senzaki ...................... 438/785 |
| 2005/0271813 | A1 | 12/2005 | Kher et al. |
| 2005/0277780 | A1 | 12/2005 | Gordon et al. |
| 2006/0138572 | A1 | 6/2006 | Arikado et al. |
| 2006/0211259 | A1 | 9/2006 | Maes et al. |
| 2006/0228888 | A1 | 10/2006 | Lee et al. |
| 2006/0244100 | A1* | 11/2006 | Ahn et al. .................... 257/532 |
| 2006/0264066 | A1* | 11/2006 | Bartholomew et al. ...... 438/785 |

FOREIGN PATENT DOCUMENTS

| | | |
|---|---|---|
| JP | 60-065712 | 4/1985 |
| JP | 03-082769 | 4/1991 |
| JP | 03-286531 | 12/1991 |
| JP | 06-080413 | 3/1994 |
| WO | WO 96/17107 | 6/1996 |
| WO | WO 01/99166 | 12/2001 |
| WO | WO 02/27063 | 4/2002 |
| WO | WO 2004/010469 | 1/2004 |
| WO | WO 2004/017378 | 2/2004 |

OTHER PUBLICATIONS

Deshpande et al., "Atomic Layer Deposition and Characterization of Hafnium Oxide Grown on Silicon from Tetrakis (Diethylamino) Hafnium and Water Vapor," *J. Vac. Sci. & Technol. A: Vacuum, Surfaces and Films* 22(5): 2035-2040 (2004).

Gutt et al., "An Advanced High-k Transistor Utilizing Metal-Organic Precursors in an ALD Deposition of Hafnium Oxide and Hafnium Silicate with Ozone as Oxidizer," *Mat. Res. Soc. Symp. Proc.* 811: 25-30 (2004).

Kawahara et al.. "Effect of Hf Sources, Oxidizing Agents, and $NH_3$/Ar Plasma on the Properties of $HfAlO_x$ Films Prepared by Atomic Layer Deposition," *Jap. J. Appl. Phys.* 43(7A): 4129-4134 (2004).

Senzaki et al., "Atomic Layer Deposition of High-k Metal Oxides for Gate and Capacitor Dielectrics," *Electrochem. Soc. Proc.* 2003-14: 423-428 (2003).

Suntola, "Atomic Layer Epitaxy," *Handbook of Crystal Growth* 3, ch. 14: 601-663 (1994).

Written Opinion for PCT/US07/70777 filed Jun. 8, 2007, dated Dec. 13, 2007.

Aggarwal et al., "Predictors of Mortality and Resource Utilization in Cirrhotic Patients Admitted to the Medical ICU", Chest, May 5, 2001, vol. 119, pp. 1489-1497.

Esaki et al., "Superlattice and Negative Differential Conductivity in Semiconductors", IMB J. Res. Develop., Jan. 1970, pp. 61-65.

Gasser et al., "Quasi-Monolayer Deposition of Silicon Dioxide", Thin Solid Films, 1994, Issue 250, pp. 213-218.

George et al., "Atomic Layer Controlled Deposition of $SiO_2$ and $Al_2O_3$ Using ABAB . . . Binary Reaction Sequence Chemistry", Applied Surface Science, 1994, Issue 82/83, pp. 460-467.

George et al., "Surface Chemistry for Atomic Layer Growth", J. Phys. Chem., 1996, vol. 100, pp. 13121-13131.

Jeon et al., "A Study on the Characteristics of TiN Thin Film Deposited by Atomic Layer Chemical Vapor Deposition Method", AVS 46th International Symposium, Oct. 25, 1999, p. 1, Seattle, WA.

Jeon et al., "Study on the Characteristics of TiN Thin Film Deposited by Atomic Layer Chemical Vapor Deposition Method", J. Vac. Sci. Technol. A, Jul./Aug. 2000, vol. 18, Issue 4, pp. 1595-1598.

Klaus et al., "Atomic Layer Deposition of $SiO_2$ Using Catalyzed and Uncatalyzed Self-Limiting Surface Reactions", Surface Review and Letters, 1999, vol. 6, Issue 3 & 4, pp. 435-448.

Klaus et al., "Atomic Layer Deposition of Tungsten and Tungsten Nitride Using Sequential Surface Reactions", AVS 46th International Symposium, Oct. 26, 1999, Seattle, WA.

Klaus et al., "Atomic Layer Deposition of Tungsten Nitride Films Using Sequential Surface Reactions", Journal of the Electrochemical Society, 2000, vol. 147, Issue 3, pp. 1175-1181.

Klaus et al., "Atomic Layer Deposition of Tungsten Using Sequential Surface Chemistry with a Sacrificial Stripping Reactions", Thin Solid Films, 2000, Issue 360, pp. 145-153.

Klaus et al., "Atomically Controlled Growth of Tungsten and Tungsten Nitride Using Sequential Surface Reactions", Applied Surface Science, 2000, Issue 162-163, pp. 471-479.

Leskela et al., "Atomic Layer Epitaxy in Deposition of Various Oxide and Nitride Thin Films", Journal De Physique IV, Jun. 1995, vol. 5, pp. 937-951.

Leskela et al., "ALD Precursor Chemistry: Evolution and Future Challenges", J. Phys. IV France, 1999, vol. 9, pp. 837-847.

Morishita et al., "New Substances for Atomic-Layer Deposition of Silicon Dioxide", Journal of Non-Chrystalline Solids, 1995, vol. 187, pp. 66-69.

Nieminen et al., "Formation and Stability of Lanthanum Oxide Thin Films Deposited from β-Diketonate Precursor", Applied Surface Science, 2001, vol. 6915, pp. 1-12.

Niinisto et al., "$HfO_2$ Films Grown by ALD Using Cyclopentadienyl-Type Precursors and $H_2O$ or $O_3$ as Oxygen Source", Journal of the Electrochemical Society, 2006, vol. 153, Issue 3, pp. F39-F45.

Niinisto et al., "Synthesis of Oxide Thin Films and Overlayers by Atomic Layer Epitaxy for Advanced Applications", Materials Science and Engineering, 1996, Issue B41, pp. 23-29.

Putkonen et al., "Low-Temperature ALE Deposition of $Y_2O_3$ Thin films from β-Diketonate Precursors", Chemical Vapor Deposition, 2001, vol. 7, Issue 1, pp. 44-50.

Riihela et al., "Introducing Atomic Layer Epitaxy for the Deposition of Optical Thin Films", Thin Solid Films, 1996, vol. 289, pp. 250-255.

Ritala et al., "Growth of Titanium Dioxide Thin Films by Atomic Layer Epitaxy", Thin Solid Films, 1993, vol. 225, pp. 288-295.

Ritala et al., "Zirconium Dioxide Thin Films Deposited by ALE Using Zirconium Tetrachloride as Precursor", Applied Surface Science, 1994, vol. 75, pp. 333-340.

Triyoso et al., Physical and Electrical Characteristics of Atomic-Layer-Deposited Hafnium Oxide Formed Using Hafnium Tetrachloride and Tetrakis(ethylmethylaminohafnium), Journal of Applied Physics, 2005, vol. 97, pp. 124107-1-124107-9.

Wise et al., "Diethyldiethoxysilane as a New Precursor for $SiO_2$ Growth on Silicon", Mat. Res. Soc. Symp. Proc., 1994, vol. 334, pp. 37-43.

Yamaguchi et al., "Atomic-Layer Chemical-Vapor-Deposition of Silicon Dioxide Films with an Extremely Low Hydrogen Content", Applied Surface Science, 1998, Issue 130-132, pp. 202-207.

\* cited by examiner

FIG. 1

ALD OF METAL SILICATE FILMS

REFERENCE TO RELATED APPLICATIONS

The present application is related to U.S. patent application Ser. No. 10/148,525 to Tois et al., filed May 31, 2002, and U.S. patent application Ser. No. 10/678,766 to Tois et al., filed Oct. 3, 2003, which are entirely incorporated by reference herein.

BACKGROUND OF THE INVENTION

1. Field of the Invention

The present invention relates to metal silicate films. In particular, the invention concerns methods for forming metal silicate films by atomic layer deposition (ALD).

2. Description of the Related Art

The integration level of components in integrated circuits is increasing, which rapidly places a demand for a decrease of the size of integrated circuit (IC) components and interconnects. Design rules are setting the feature sizes to $\leqq 0.2$ µm, making complete film coverage on deep bottoms and vias difficult to obtain using traditional methods. Additionally, with decreasing feature sizes, quantum mechanical tunneling ("tunneling") leads to leakage current, i.e., current leaking out of device features (e.g., across gate oxides), which adversely affects device performance. For this reason, substantially thin $SiO_2$ films are unreliable as gate dielectrics (gate oxides), for example, in MOSFET (metal-oxide-semiconductor field-effect transistor) devices. Thus, a dielectric material with a high dielectric constant ("high-k dielectric") is desirable.

High-k dielectric materials should preferably be able to be deposited on silicon surfaces and remain stable under thermal annealing processes. In gate dielectric applications, electrically active defects should be minimized or prevented from forming at interfaces between silicon wafers and high-k dielectrics. In memory applications, such as in dynamic random access memory (DRAM) applications, the structure of the dielectric should preferably be substantially stable under high activation temperatures. It has been found that mixing silicon oxide ($SiO_x$, where 'x'=1 or 2) with a metal oxide forms stable metal silicates that can be used as high-k dielectrics with desirable properties.

Hafnium silicate ($HfSiO_x$) and Zirconium silicate ($ZrSiO_x$) have been used to replace silicon oxide in some applications, such as complementary metal oxide semiconductor (CMOS) applications, because they can offer excellent thermal stability and device performance in integrated circuits with device features sizes of about 65 nanometers (nm) or less. However, with decreasing features sizes, it has become increasingly difficult to deposit hafnium silicate films with compositional and thickness uniformities suited for current and future generation of ICs.

A problem with prior art ALD methods is that halide-based source chemicals (e.g., $MX_4$ and $SiY_4$, wherein "M" is a metal and "X" and "Y" are halides) leave halogen atoms in the metal silicate film, leading to substantially high "fixed charge" concentrations that can degrade the performance of electrical devices, such as CMOS and DRAM devices. On the other hand, purely organic source chemicals lead to carbon impurities in the film, which behave as charge centers. At high concentrations, carbon impurities promote leakage currents that lead to increased power consumption in CMOS devices and decreased storage capabilities in DRAM devices.

Methods that have previously been employed in ameliorating the problems with metal silicate films formed using exclusively halide or organic-based source chemicals typically involve annealing and/or oxidizing the films. These methods can lead to substantial increases in processing costs and may promote oxidation of the interface between the metal silicate film and the underlying substrate, thus leading to poor film quality and poor device performance.

SUMMARY OF THE INVENTION

According to one aspect of the invention, ALD methods for forming a metal silicate film are provided. In preferred embodiments, the methods comprise alternately contacting a substrate in a reaction space with vapor phase pulses of an alkyl amide metal compound, a silicon halide compound and an oxidizing agent.

In some embodiments, ALD processes for forming a metal silicate film comprise (a) contacting a substrate in a reaction space with a vapor phase pulse of an alkyl amide metal compound; (b) removing excess alkyl amide metal compound and reaction by-products from the reaction space; (c) contacting the substrate with a vapor phase pulse of a first oxidizing agent; (d) removing excess first oxidizing agent and reaction by-products from the reaction space; (e) contacting the substrate with a vapor phase pulse of a silicon halide compound; (f) removing excess silicon halide compound and reaction by-products from the reaction space; (g) contacting the substrate with a vapor phase pulse of a second oxidizing agent; (h) removing excess second oxidizing agent and reaction by-products from the reaction space; and (i) repeating steps (a) through (h) until a hafnium silicate film of desired thickness is formed over the substrate.

In other embodiments, ALD methods are provided for forming a metal silicate film for use in a dynamic random access memory (DRAM) device. The methods comprise alternately and sequentially providing into a reaction space vapor phase pulses of an alkyl amide metal compound and an oxidizing agent to deposit metal oxide over a substrate in the reaction space. The methods further comprise alternately and sequentially providing into the reaction space vapor phase pulses of a silicon halide compound and an oxidizing agent to deposit silicon oxide over the substrate.

In still other embodiments, ALD methods for forming a metal silicate film for use as a gate dielectric in a complementary metal oxide semiconductor (CMOS) device are provided. The methods comprise providing into a reaction space a vapor phase pulse of an alkyl amide metal compound to deposit at most a monolayer of a metal-containing film on a substrate in the reaction space. A vapor phase pulse of an oxidizing agent is provided into the reaction space to oxidize the deposited metal to metal oxide, thereby forming a metal-oxide containing film. A vapor phase pulse of a silicon halide compound is provided into the reaction space to deposit silicon on the substrate. A vapor phase pulse of an oxidizing agent is provided into the reaction space to oxidize the deposited silicon to silicon oxide, thereby forming the metal silicate film.

In other embodiments, hafnium silicate films are provided. The hafnium silicate films preferably comprise carbon impurity concentrations of less than or equal to about 50,000 parts-per-million (ppm) and halogen impurity concentrations of less than or equal to about 20,000 ppm. In some embodiments, the hafnium silicate films have step coverages greater than or equal to about 85%.

All of these embodiments are intended to be within the scope of the invention herein disclosed. These and other embodiments of the present invention will become readily apparent to those skilled in the art from the following detailed description of some preferred embodiments and reference to the attached figure, the invention not being limited to any of the particular preferred embodiments disclosed.

BRIEF DESCRIPTION OF THE DRAWINGS

The invention will be better understood from the Detailed Description of the Preferred Embodiments and from the appended drawing, which is meant to illustrate and not to limit the invention.

DETAILED DESCRIPTION OF THE PREFERRED EMBODIMENTS

Metal silicate films formed using alkyl amide metal source chemicals (i.e., metal source chemicals comprising alkyl amide ligands) in combination with halide-based silicon source chemicals can advantageously permit formation of high quality metal silicate films at substantially lower temperatures, thereby enabling improved step coverage relative to films formed using prior art methods. Additionally, alkyl amide metal source chemicals, due to the lower barrier of activation, permit higher growth rates at lower temperatures relative to films formed using only halide-based source chemicals, thus enabling substantial savings in processing costs. Films formed according to preferred methods have carbon and halogen impurity levels that offer improved scalability and fixed charge characteristics for various applications, such as gate stacks in CMOS devices, dielectric layers in DRAM devices and components of other capacitor-based devices.

As used herein, "an ALD process" generally refers to a process for producing thin films over a substrate molecular layer by molecular layer using self-saturating chemical reactions. The general principles of ALD are disclosed, e.g., in U.S. Pat. Nos. 4,058,430 and 5,711,811, and Suntola, e.g., in the Handbook of Crystal Growth 3, Thin Films and Epitaxy, Part B: Growth Mechanisms and Dynamics, Chapter 14, Atomic Layer Epitaxy, pp. 601-663, Elsevier Science B.V. 1994, the entire disclosures of which are incorporated herein by reference. In a typical ALD process, gaseous reactants are conducted separately (usually alternately and sequentially) into a reaction space of an ALD type reactor where they contact a substrate located in the space to provide a surface reaction. The pressure and the temperature of the reaction space are adjusted to a range where physisorption (i.e., condensation of gases) and thermal decomposition of the precursors are avoided. In addition, reactants that do not react with themselves are selected. Consequently, only up to one monolayer (i.e., an atomic layer or a molecular layer) of material is deposited at a time during each pulsing cycle. The actual growth rate of the thin film, which is typically presented as Å/pulsing cycle, depends, for example, on the number of available reactive surface sites and the bulkiness of the reactant molecules. That is, once all available binding sites are filled, no additional surface reactions are possible. Gas phase reactions between precursors and any undesired reaction by-products are inhibited because reactant pulses are separated from each other by time and/or space. The reaction space is typically purged with an inert gas (e.g., $N_2$, Ar, He, or $H_2$) and/or evacuated, e.g., using a vacuum pump, between reactant pulses to remove excess gaseous reactants and reaction by-products, if any.

Definitions

"Reaction space" is used to designate a reactor or reaction chamber, or an arbitrarily defined volume therein, in which conditions can be adjusted to effect film growth over a substrate by ALD. The reaction space typically includes surfaces subject to all reaction gas pulses from which gases or particles can flow to the substrate, by entrained flow or diffusion, during normal operation. The reaction space can be, for example, the reaction chamber in a single-wafer ALD reactor or the reaction chamber of a batch ALD reactor, where deposition on multiple substrates takes place at the same time. The reactor can be configured for plasma generation, either in situ or remote.

"Plasma-excited species" refers to radicals, ions or other excited species generated via application (or coupling) of energy to a reactant gas. Energy may be applied via a variety of methods, such as, e.g., induction, ultraviolet radiation, microwaves and capacitive coupling. The plasma generator may be a direct plasma generator (i.e., in situ or direct plasma generation) or a remote plasma generator (i.e., ex situ or remote plasma generation). In the absence of coupling energy, plasma generation is terminated. Plasma-excited species include, without limitation, hydrogen radicals. For in situ plasma generation, plasma-excited species of a particular vapor phase chemical (e.g., $O_2$) are formed in a reaction space comprising a substrate to be processed. For remote plasma generation, plasma-excited species are formed external to the reaction space comprising the substrate.

"Adsorption" is used to designate a chemical attachment of atoms or molecules on a surface.

"Substrate" is used to designate any workpiece on which deposition is desired. Typical substrates include, without limitation, silicon, silica, coated silicon, copper metal and nitride.

"Surface" is used to designate a boundary between the reaction space and a feature of the substrate.

"Metal silicate film" designates a film that comprises silicon, one or more metals and oxygen. A metal silicate film can be generally denoted by $M_xSi_yO_z$, wherein "M" designates one or more metals and "x", "y" and "z" are numbers greater than zero. A metal silicate film can be formed by depositing tiered and alternating layers of silicon oxide (e.g., SiO, $SiO_2$) and a metal oxide. As an example, a hafnium silicate film may be formed from alternating layers of $HfO_2$ and $SiO_2$. As another example, a hafnium silicate film can be formed by depositing three layers of hafnium oxide separated by a layer of silicon oxide. Preferably, the metal silicate film has a uniform composition throughout at the microscopic scale.

Metal Silicate Deposition Process

The methods presented herein allow controlled deposition of a conformal metal silicate film on a substrate surface. Geometrically challenging applications, such as deposition in high aspect-ratio features (e.g., vias and trenches), are possible due to the self-limiting nature of the surface reactions using preferred chemistries provided herein.

According to some preferred embodiments, ALD process is used to form metal silicate films over a substrate, such as an integrated circuit (IC) workpiece. The substrate or workpiece is placed in a reaction space and subjected to alternately repeated surface reactions of a silicon source chemical, a metal source chemical and an oxidizing agent. Preferred ALD methods include plasma-enhanced ALD (PEALD) processes, in which plasma-excited species are used as oxidizing agents, and "thermal" ALD processes, in which the substrate is heated during deposition.

Preferably, each ALD cycle comprises at least four deposition steps or phases and utilizes at least three different reactants. Although referred to as the "first," second," and "third" reactants, these designations do not imply that the reactants have to be introduced in this order. In some embodiments, an ALD cycle may start with the second reactant or the third reactant. In some cases, a fourth reactant may be employed, for example, if two different oxidizing species are to be used (as discussed in more detail below). Similarly, although referred to as first, second, third and fourth phases, they are not necessarily carried out in this sequence. For example, in some cases deposition may start with the third phase. Additional phases may be included, depending on, e.g., the desired film composition.

The first reactant (also referred to as a "metal reactant" herein) is a metal source chemical and will chemisorb no more than about one monolayer of a metal (or a plurality of metals if a source chemical comprising a plurality of metals is used, or if a plurality of metal source chemicals are used) on the substrate surface. The metal reactant preferably comprises a transition metal ("metal") species desired in the metal silicate film being deposited. Preferably, the metal reactant is a vapor phase species comprising one or both of zirconium (Zr) and hafnium (Hf).

The metal reactant is preferably a compound comprising alkyl and/or amide groups, more preferably an alkyl amide metal compound. Preferred alkyl amide metal compounds include etrakis(ethylmethylamino)metal (TEMA-m, wherein "m" is the metal), tetrakis(diethylamino)metal (TDEA-m) and tetrakis(dimethylamino)metal (TDMA-m). If the metal silicate film to be formed comprises Hf, the metal reactant is preferably an alkyl amide Hf source chemical, more preferably a source chemical selected from the group consisting of tetrakis(ethylmethylamino)hafnium (TEMAH), tetrakis(diethylamino)hafnium (TDEAH) and tetrakis(dimethylamino)hafnium (TDMAH). If the metal silicate film to be formed comprises Zr, the metal reactant is preferably an alkyl amide zirconium compound, more preferably a source chemical selected from the group consisting of tetrakis(ethylmethylamino)zirconium (TEMAZ), tetrakis(diethylamino)zirconium (TDEAZ) and tetrakis(dimethylamino)zirconium (TDMAZ).

The second reactant (also referred to as "oxidizing agent" or "oxidizing species" herein) comprises an oxidizing agent. In preferred embodiments, the oxidizing agent is capable of oxidizing silicon and metals on the substrate surface. In preferred embodiments, the oxidizing agent is a vapor phase species selected from the group consisting of water, ozone and plasma-excited species of molecular oxygen ($O_2$). When plasma-excited species of $O_2$ are used, the oxidizing agent comprises oxygen ions and/or radicals (i.e., plasma-excited species of oxygen). As mentioned above, plasma-excited species of oxygen may be generated in the reaction space comprising the substrate using, e.g., a showerhead-type PEALD reactor, such as the reactor disclosed in U.S. patent application Ser. No. 10/486,311, the disclosure of which is incorporated herein by reference in its entirety. In other embodiments, plasma-excited species of oxygen are generated externally (i.e., remote plasma generation) and directed into the reaction space comprising the substrate. The oxidizing agent preferably reacts with silicon and/or metal on the substrate surface to form silicon oxide and/or metal oxide.

If plasma-excited species are formed in situ, various "plasma parameters" may be selected to regulate plasma generation. Plasma parameters include, without limitation, radio frequency ("RF") power on time, RF power amplitude, RF power frequency, reactant concentration, reactant flow rate, reaction space pressure, total gas flow rate, reactant pulse durations and separations, and RF electrode-to-substrate spacing. As an example, the spacing between a showerhead and the substrate surface may be selected to direct plasma-excited species of oxygen predominantly to the substrate surface. In this manner, exposure of plasma-excited species of oxygen at other locations of the reaction space (e.g., reaction space walls not in view of the plasma) may be minimized, if not eliminated.

The third reactant (also referred to as "silicon reactant" herein) is preferably a vapor phase silicon source chemical (also referred to as "silicon source material" or "silicon halide source chemical" herein) and will chemically adsorb ("chemisorb") on the substrate surface in a self-limiting manner to form no more than about one monolayer of silicon. In preferred embodiments, the silicon source chemical is a silicon halide compound, such as, e.g., $Si_xW_yH_z$, wherein "W" is a halide selected from the group consisting of F, Cl, Br and I, "x" and "y" are integers greater than zero, and "z" is an integer greater than or equal to zero. The silicon halide compound preferably forms a molecular monolayer (also "monolayer" herein) terminated with halogen ligands on the substrate. A silicon halide source chemical may be selected from the group consisting of silicon fluorides (e.g., $SiF_4$), silicon chlorides (e.g., $SiCl_4$), silicon bromides (e.g., $SiBr_4$), and silicon iodides (e.g., $SiI_4$). In some embodiments, the silicon halide compound is silicon tetrachloride ($SiCl_4$).

In some embodiments, for example, if the deposited silicon and metal are to be separately oxidized using different oxidizing agents, a fourth reactant may be used. The fourth reactant is preferably an oxidizing agent, more preferably an oxidizing agent selected from the group consisting of water, ozone and plasma-excited species of molecular oxygen ($O_2$). Depending on the specific circumstances, one or more additional reactants may be provided. For example, an additional metal reactant may be utilized if more than one metal is to be incorporated in the silicate.

It will be appreciated that prior to deposition of a metal silicate film, the substrate may be provided with an initial surface termination. As an example, a silicon substrate may be contacted with water to form OH surface terminations on one or more surfaces of the substrate.

In one phase of the ALD cycle, herein referred to as the "first phase," after initial surface termination, if desired, a pulse of the metal reactant (i.e., metal source chemical) is supplied to the reaction space to form no more than about one monolayer of a metal-containing film on the substrate surface. The amount of metal source chemical that can adsorb on the surface is determined at least in part by the number of available binding sites on the surface and by the physical size of the chemisorbed species (including ligands). The metal source chemical, which is preferably an alkyl amide source chemical (e.g., TEMAH, TEMAZ), can be provided with the aid of a carrier gas (e.g., $N_2$, He, Ar). Due to the size of the chemisorbed species and the number of reactive sites, less than a monolayer (ML) is typically deposited in each pulse of the metal source chemical. The chemisorbed layer left by the pulse of the metal source chemical is self-terminated with a surface that is non-reactive with the remaining chemistry of that pulse. This phenomenon is referred to herein as "self-saturation." One of skill in the art will recognize that the self-limiting nature of this phase makes the entire ALD cycle self-limiting.

Excess metal source chemical and reaction by-products (if any) are removed from the reaction space, for example with the aid of a purge gas (e.g., $N_2$, He, Ar) and/or a vacuum generated by a pumping system. If the metal source chemical is supplied with the aid of a carrier gas, excess metal source chemical and reaction by-products may be removed by terminating the flow of the metal source chemical and continuing to supply the carrier gas. In this respect, the carrier gas serves as the purge gas.

In the next phase of the ALD cycle, herein referred to as the "second phase," a pulse of the oxidizing agent is provided into the reaction space. The oxidizing agent may be introduced with the aid of a carrier gas (e.g., $N_2$, He, Ar). The oxidizing agent reacts with the metal-containing film left on the substrate surface by the preceding pulse. The oxidizing agent preferably oxidizes metal in the previously deposited film to metal oxide ($MO_x$, wherein "M" is a metal). As an example, if the metal being deposited is hafnium, the oxidizing agent preferably oxidizes hafnium to hafnium oxide $HfO_x$ (e.g., HfO, $HfO_2$).

Excess oxidizing agent and reaction by-products (if any) are removed from the reaction space. This step may include purging the reaction space with an inert gas (e.g., $N_2$, He, Ar) and/or pumping the reaction space with the aid of a pumping system after terminating the pulse of the oxidizing agent. If the oxidizing agent includes plasma-excited species of oxygen, the removal step may include terminating power to the plasma generator and purging excess oxidizing agent and reaction by-products, if any, e.g., with the aid of an inert gas. As an alternative, molecular oxygen ($O_2$) may serve as the purge gas, such that when plasma power is terminated, oxygen is directed through the reaction space to purge reaction by-products, if any. If the oxidizing agent is supplied with the aid of a carrier gas, excess oxidizing agent and reaction by-products, if any, may be removed by terminating the flow of the oxidizing agent and continuing to supply the carrier gas.

Thus, during the first phase and the second phase, a metal oxide film is formed on the substrate. The first phase and the second phase (performed in sequence) can be collectively referred to as the "metal oxide phase".

In the next phase of the ALD cycle, herein referred to as the "third phase," the silicon reactant (i.e., silicon source chemical) is provided into the reaction space to deposit no more than about one monolayer of a silicon-containing film on the substrate surface. The silicon source chemical, which is preferably a halogen-containing silicon source chemical (e.g., $SiCl_4$), can be provided with the aid of an inert carrier gas. Maximum step coverage on the workpiece surface is obtained when no more than about a one monolayer of the silicon source chemical is chemisorbed in each self-limiting pulse. Due to the size of the chemisorbed species and the number of reactive sites, less than a monolayer (ML) is typically deposited in each pulse of the silicon source chemical.

Excess silicon reactant and reaction by-products (if any) are removed from the reaction space. This step may include terminating the pulse of the silicon reactant and purging the reaction space with an inert gas (e.g., $N_2$, He, Ar) and/or pumping the reaction space with the aid of a pumping system. If the silicon reactant is supplied with the aid of a carrier gas, excess silicon reactant and reaction by-products, if any, may be removed by terminating the flow of the silicon reactant and continuing to supply the carrier gas.

In the next phase of the ALD cycle, herein referred to as the "fourth phase", a pulse of an oxidizing agent is provided into the reaction space. The oxidizing agent may be to the same as the oxidizing agent used in the second phase. However, the skilled artisan will understand that in some cases a different oxidizing agent (i.e., fourth reactant) than that used in the second phase may be used. The oxidizing agent reacts with the silicon left on the substrate surface by the preceding pulse to form a silicon oxide ($SiO_x$). It will be appreciated that $SiO_x$ may comprise SiO (partial oxidation) and $SiO_2$ (complete oxidation). In preferred embodiments, the oxidizing agent completely oxidizes silicon to $SiO_2$.

Thus, during the third and fourth phases, a silicon oxide film is deposited (or formed) on the substrate. The third and fourth phases (performed in sequence) can be collectively referred to as the "silicon oxide phase."

As mentioned above, it will be appreciated that alternatives to the sequence of steps outlined above are possible. As an example, the silicon oxide phase may precede the metal oxide phase. Thus, in some embodiments, a pulsing sequence may include the following sequence of pulses: silicon reactant pulse/oxidizing agent pulse/metal reactant pulse/oxidizing agent pulse. In other embodiments, the reactant pulses may initiate with an oxidizing agent pulse. As an example, the reactant pulses may include the following sequence of pulses: oxidizing agent pulse/metal reactant pulse/oxidizing agent pulse/silicon reactant pulse/oxidizing agent pulse. In other embodiments, formation of the metal silicate film may proceed according to the following sequence of pulses: metal reactant pulse/silicon reactant pulse/oxidizing agent pulse. As an alternative, the silicon reactant pulse may precede the metal reactant pulse such that the pulsing sequence is silicon reactant pulse/metal reactant pulse/oxidizing agent pulse. The reactant pulses are preferably separated by a removal step, in which excess reactants and/or reaction by-products (if any) are removed from the reaction space, preferably with the aid of a purge gas and/or a pumping system, as described above.

It will be appreciated that each of the phases (either in combination with another phase or individually) may be repeated a predetermined number of times prior to the other phases. For example, the metal oxide phase can be repeated five times prior to the silicon oxide phase. As another example, the silicon oxide phase can be repeated eight times prior to the metal oxide phase. This can allow control of the stoichiometry of the metal silicate film being formed. If a metal-rich metal silicate film is desired, the metal oxide phase may be repeated several times prior to the silicon oxide phase. On the other hand, if a silicon-rich metal silicate film is desired, the silicon oxide phase can be repeated several times prior to the metal oxide phase. A film with more than one type of metal can be formed by adding additional metal phases.

The skilled artisan will understand that the number of times the metal oxide and/or silicon oxide phases are repeated is selected to permit formation of films with stoichiometries suitable for various electronics applications.

A phase is generally considered to immediately follow another phase if only a purge or other reactant removal step intervenes.

In one embodiment, an ALD cycle comprises:

1. providing a vapor phase pulse of an alkyl amide metal compound to the reaction space;

2. purging and/or evacuating excess metal source chemical and reaction by-products from the reaction space;

3. providing a vapor phase pulse of an oxidizing agent to the reaction space;

4. purging and/or evacuating excess oxidizing agent and reaction by-products from the reaction space;

5. providing a vapor phase pulse of a silicon halide to the reaction space;

6. purging and/or evacuating excess silicon source chemical and reaction by-products from the reaction space;

7. providing a vapor phase pulse of an oxidizing agent to the reaction space; and 8. purging and/or evacuating excess oxidizing agent and reaction by-products from the reaction space.

Thus, in one complete metal silicate ALD cycle, formation of the metal silicate film proceeds via formation of a metal oxide film followed by formation of a silicon oxide film. The sequence of steps (steps 1-8) described above may be repeated to form a metal silicate film of desired thickness.

In an alternative embodiment, the ALD sequence described above begins with the vapor phase pulse of the silicon source chemical (step 5), which is sequentially followed by steps 6, 7, 8, 1, 2, 3 and 4. Thus, in one metal silicate ALD cycle, formation of the metal silicate film may proceed via formation of a silicon oxide film followed by formation of a metal oxide film.

It will be appreciated that the substrate may be heated during one or more of the processing steps above. As an example, the substrate may be heated during steps 1 and 5 to provide activation energy for reaction between the silicon surface or a previously-deposited film and the metal or silicon reactant. As another example, the substrate may be heated during steps 1-8.

In preferred embodiments, providing an oxidizing agent (steps 3 and 7) includes introducing molecular oxygen ($O_2$) into the reaction space comprising the substrate and generating plasma-excited species of oxygen in situ (i.e., in the reaction space). Power is provided to an RF electrode to generate the plasma. After a desired exposure time, plasma production is terminated and excess $O_2$ and reaction by-products (if any) are removed from the reaction space using a purge and/or evacuation step (steps 4 and 8). In other embodiments, plasma-excited species of oxygen are generated in a chamber in fluid communication with the reaction space comprising the substrate, and subsequently directed into the reaction space.

It will be appreciated that one or more of steps 1-8 can be repeated a desired number of times prior to subsequent steps. In some cases, this can provide a desired level of metal and/or silicon coverage on the substrate surface. As an example, steps 1-4 (the metal oxide phase) can be repeated from about 1 to 100 times, more preferably about 5 times prior to steps 5-8 (the silicon oxide phase). As another example, steps 5-8 can be repeated ten times, more preferably about 7 or 8 times, prior to steps 1-4.

The substrate temperature and/or reaction space pressure can be selected to optimize growth of the metal silicate film. Films are formed at a substrate temperature preferably between about 150° C. and 500° C., more preferably between about 250° C. and 350° C. The pressure of the reaction space during formation of the metal silicate film is preferably between about 0.1 and 100 Torr, more preferably between about 0.5 and 10 Torr.

Figure 1:
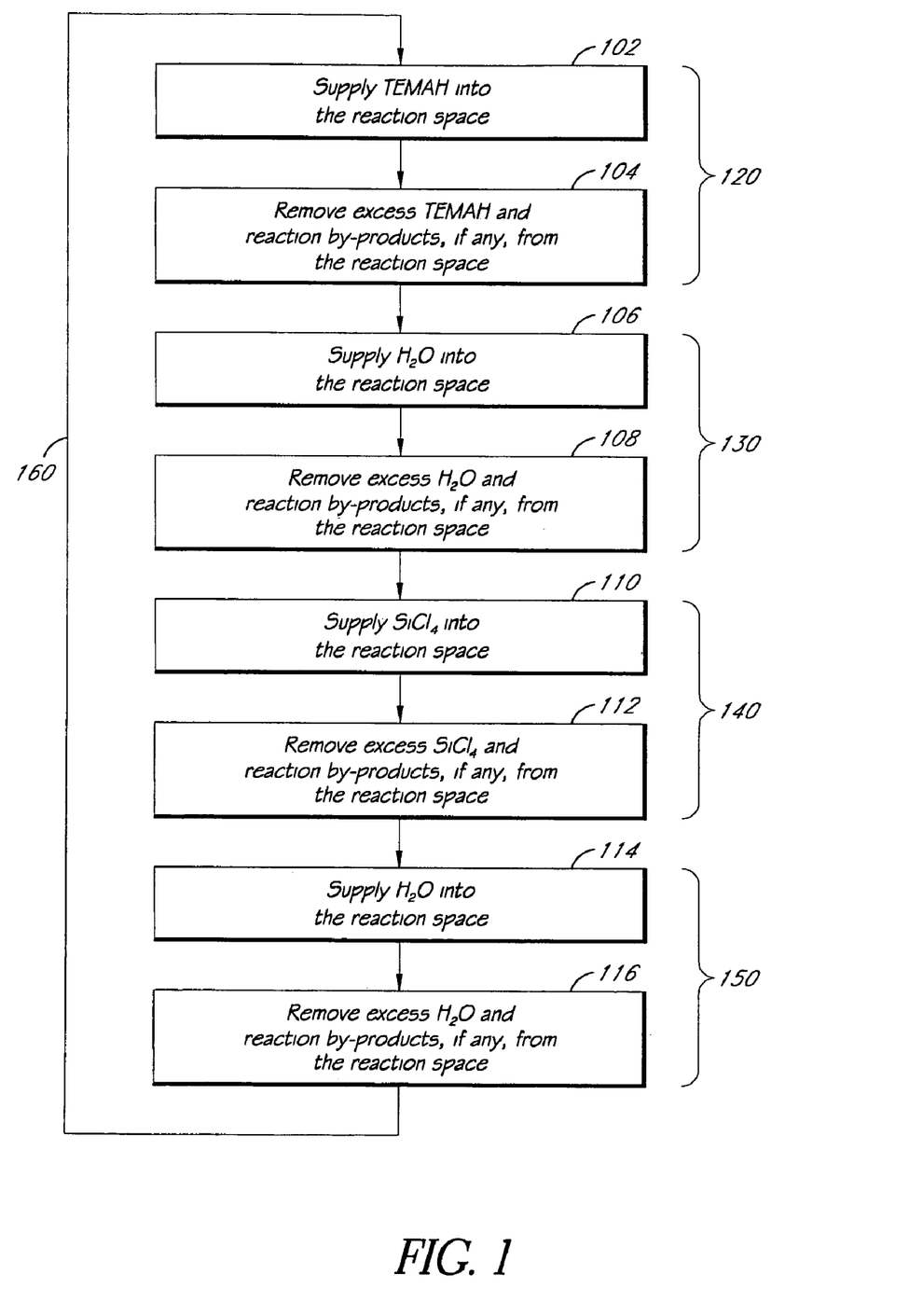
FIG. 1 is a block diagram of a pulsing sequence according to a preferred embodiment of the invention.

An exemplary pulsing sequence according to methods of preferred embodiments is illustrated in FIG. 1. In the illustrated embodiment, the metal silicate film being formed is hafnium silicate. It will be appreciated, however, that these methods can be applied to forming metal silicate films comprising other metals, such as zirconium, in which case the metal source chemical used can be selected as described above.

With reference to FIG. 1, after initial surface termination, if necessary or desired, a metal reactant or source material is supplied 102 into the reaction space comprising the substrate. In the illustrated embodiment, the metal reactant is TEMAH, which is supplied into the reaction space with the aid of a carrier gas (e.g., $N_2$, He, or Ar). The metal reactant pulse 102 self-saturates the workpiece surfaces in such a way that any excess constituents of the metal reactant pulse do not further react with the monolayer formed by this process. Self-saturation is facilitated by ligands, terminating the monolayer, which protect the layer from further reaction with the reactant.

Next, excess metal reactant is removed 104 from the reaction space. Step 104 may entail stopping the flow of the metal reactant or chemistry while continuing to flow a carrier gas for a sufficient time to diffuse or purge excess reactants and reaction by-products from the reaction space. For other embodiments, the purge gas is different from the carrier gas. In such a case, the carrier gas serves as the purge gas during the reactant removal step 104. Preferably, the reaction space is purged with greater than about two reaction space volumes of the purge gas, more preferably with greater than about three reaction space space volumes. Preferably, the removal 104 comprises flowing purge gas for between about 0.1 seconds and 20 seconds after stopping the flow of the metal reactant pulse. Inter-pulse purging is described, for example, in U.S. Pat. No. 6,511,539, filed Sep. 8, 1999, entitled, "Apparatus and Method for Growth of a Thin Film," the entire disclosure of which is incorporated herein by reference. In other arrangements, for example, if the metal source chemical is provided without a carrier gas, step 104 may entail terminating the flow of the metal source chemical and introducing an inert gas into the reaction space. In some arrangements, the reaction space may be pumped down between alternating chemistries. See, for example, PCT publication number WO 96/17107, published Jun. 6, 1996, entitled "Method and Apparatus for Growing Thin Films," the entire disclosure of which is incorporated herein by reference. Thus, the removal step 104 may entail simultaneously purging and pumping the reaction space. Together, the adsorption 102 and reactant removal 104 represent a first phase 120 of the illustrated ALD cycle.

Next, an oxidizing agent is pulsed 106 to the substrate. The oxidizing agent desirably reacts with or adsorbs upon the monolayer left by the metal reactant. In the illustrated embodiment, the oxidizing agent is $H_2O$, which oxidizes hafnium to hafnium oxide ($HfO_x$), such as, e.g., HfO and $HfO_2$.

After a time period sufficient to oxidize the monolayer, the $H_2O$ pulse is terminated and excess water vapor and any reaction by-products are removed 108 from the reaction space, preferably with the aid of a purge gas pulse and/or a vacuum generated by a pumping system. The removal step 108 may be as described for step 104 above. Together, steps 106 and 108 represent a second phase 130 of the illustrated ALD process.

Next, a silicon reactant or source material is supplied 110 to the substrate. In accordance with preferred embodiments, the silicon reactant pulse 110 comprises providing a volatile halogen-containing silicon source chemical. Accordingly, in step 110 a halogen-containing silicon film is formed on the hafnium oxide film formed in the first and second phases 120 and 130. In the illustrated embodiment, the silicon reactant is silicon tetrachloride ($SiCl_4$) and the silicon reactant pulse 110 leaves no more than a monolayer of a silicon-containing film on the substrate.

After a time period sufficient to completely saturate and react the monolayer with the silicon reactant 110, excess silicon reactant and reaction by-products, if any, are removed 112 from the reaction space. As with removal step 104 above, step 112 preferably comprises stopping the flow of the third chemistry (silicon reactant) and continuing to flow carrier gas for a time period sufficient to remove excess reactants and any reaction by-products from the reaction space. Together, the silicon reactant pulse 110 and removal step 112 represent a third phase 140 of the illustrated ALD process.

Next, the oxidizing agent ($H_2O$) is pulsed 114 to the workpiece. Water desirably reacts with the monolayer left by the silicon reactant. Water oxidizes the silicon deposited in step 110 to silicon oxide, preferably a silicon oxide selected from the group consisting of SiO and $SiO_2$, thereby forming a silicon oxide film on the substrate. Exposure of the film to water may be accompanied by the formation of HCl, which evolves into the gas phase. However, it will be appreciated that halogen atoms may remain in the film following step 114. While water is used in illustrated step 114, the oxidizing agent used in step 114 may differ from that used in step 106. As an example, plasma-excited species of oxygen may be used in step 114.

After a time period sufficient to oxidize the monolayer left in the third phase 140, the pulse of the oxidizing agent ($H_2O$) is terminated and excess water vapor and any reaction by-products are removed 116 from the reaction space, preferably with the aid of a purge gas pulse and/or a vacuum generated by a pumping system. The removal step 116 can be as described for step 104 above. Together, steps 114 and 116 represent a fourth phase 150 of the illustrated ALD process.

The first phase 120, second phase 130, third phase 140 and fourth phase 150 are repeated 160 until a hafnium silicate film of desired thickness is formed on the substrate. For example, the four phases may be repeated 10 times, 100 times, 1000 times or more to form a compositionally uniform hafnium silicate film.

In another alternative embodiment (not shown), the ALD sequence illustrated in FIG. 1 begins with the third phase 140 and is sequentially followed by the fourth phase 150, the first phase 120 and the second phase 130. In such a case, the sequence of steps includes: silicon source chemical pulse/reactant removal/oxidizing species pulse/reactant removal/metal source chemical pulse/reactant removal/oxidizing species pulse/reactant removal. This sequence may be repeated until a hafnium silicate film of desired thickness is formed on the substrate. As a particular example, a hafnium silicate film may be formed by an ALD cycle comprising the following vapor phase pulsing sequence: $SiCl_4$/inert gas/$H_2O$/inert gas/TEMAH/inert gas/$H_2O$/inert gas.

In an alternative embodiment (not shown), the ALD sequence illustrated in FIG. 1 begins with the first phase 120 and is sequentially followed by the third phase 140 and the fourth phase 150. In such a case, the second phase is omitted. Accordingly, the sequence of steps includes: metal reactant pulse/reactant removal/silicon reactant pulse/reactant removal/oxidizing agent pulse/reactant removal. This sequence may be repeated until a hafnium silicate film of desired thickness is formed on the substrate. As a particular example, a hafnium silicate film may be formed by an ALD cycle comprising the following vapor phase pulsing sequence: TEMAH/inert gas/$SiCl_4$/inert gas/$H_2O$/inert gas.

Metal silicate films formed according to preferred methods preferably have thicknesses between about 0.5 and 40 nm, more preferably between about 1 and 15 nm. It will be understood that thicknesses can vary with application. For example, in gate dielectrics for CMOS devices, the metal silicate films preferably have thicknesses between about 1 and 5 nm. As another example, in DRAM devices, the metal silicate films preferably have thicknesses between about 3 and 15 nm. The skilled artisan will be able to select an appropriate thickness for a particular application.

Thus, according to the foregoing embodiments, a metal silicate film is formed on a substrate. Depending on their desired use, metal silicate films formed according to preferred methods have step coverages greater than or equal to about 80%, preferably greater than or equal to about 85%, and more preferably greater than or equal to about 95%, and most preferably about 100%, and dielectric constants preferably between about 4 and 50, more preferably between about 8 and 30. Metal silicate films formed according to methods described herein preferably have carbon impurity concentrations less than or equal to about 50,000 parts-per-million (ppm), preferably less than or equal to about 25,000 ppm, more preferably less than or equal to about 15,000 ppm and most preferably less than or equal to about 10,000 ppm. Halogen (e.g., chlorine) impurity concentrations are less than or equal to about 20,000 parts-per-million (ppm), preferably less than or equal to about 10,000 ppm, more preferably less than or equal to about 5,000 ppm and most preferably less than or equal to about 2,000 ppm. Metal silicate films formed according to methods described herein preferably have "within wafer" (WIW) uniformities (1 sigma) of less than about 1% on surfaces comprising high aspect ratio trenches and vias. Leakage current densities are preferably less than or equal to about $1 \times 10^{-3}$ $A/cm^2$ at an effective oxide thickness (EOT) of about 1.5 nm, more preferably less than or equal to about $1 \times 10^{-4}$ $A/cm^2$ at an EOT of about 1.5 nm, and most preferably less than or equal to about $1 \times 10^{-5}$ $A/cm2$ at an EOT of about 1.5 nm. Metal silicate films formed according to methods described herein preferably have metal and silicon concentrations between about 40% metal/60% Si to about 90% metal/10% Si.

It will be appreciated that methods of preferred embodiments can be used to form metal silicate films comprising hafnium and zirconium (i.e., $Hf_xZr_yO_x$, wherein "x", "y" and "z" are numbers greater than zero). In such a case, the metal silicate film may be formed by depositing alternating layers of hafnium oxide ($HfO_x$) (or zirconium oxide ($ZrO_x$))/silicon oxide/zirconium oxide (or Hf oxide). For example, a hafnium-zirconium silicate may be deposited from the following series of ALD cycles: hafnium oxide/silicon oxide/zirconium oxide/silicon oxide/hafnium oxide/silicon oxide/zirconium oxide. Alternatively, forming a hafnium-zirconium silicate may comprise depositing a hafnium-zirconium mixed oxide ($HfZrO_x$) layers and intervening silicon oxide layers. In such a case, the hafnium-zirconium silicate may be deposited by ALD cycles: $HfZrO_x/SiO_x/HfZrO_x/SiO_x$. In such a case, during the metal oxide phase, as described above, alkyl amide hafnium and zirconium source chemicals may be simultaneously or alternately pulsed into the reaction space. As an alternative, a source chemical comprising zirconium and hafnium may be used as the metal reactant in this case.

The aforesaid embodiments will be further illustrated in the context of two examples, which are not intended to limit the scope of the invention.

EXAMPLE 1

A hafnium silicate film was deposited on a 300 mm silicon wafer using a Pulsar™ reactor manufactured by ASM America, Inc. The wafer included trenches with depth-to-width aspect ratios greater than about 50:1. Deposition was conducted at a substrate temperature in the range of about 250 to 320° C. The sequence processing steps included the following:

(1) TEMAH pulse;
(2) Ar purge;
(3) $H_2O$ pulse;
(4) Ar purge;
(5) $SiCl_4$ pulse;
(6) Ar purge;

(7) $H_2O$ pulse; and
(8) Ar purge.

Steps (1)-(8) were repeated until a hafnium silicate film with a thickness of about 34 Å was formed on the silicon wafer. Uniform coverage was achieved within the trenches. A step coverage in excess of 95% was achieved. The film had a uniformity (1 sigma) of about 0.78%.

EXAMPLE 2

A hafnium silicate film was grown on a 300 mm silicon wafer at a wafer temperature of about 300° C. TEMAH was used as the metal reactant, SiCl4 was used as the silicon reactant and water was used as the oxidizing agent. The pulsing sequence was $TEMAH/H_2O/SiCl_4/H_2O$. The reaction space was purged with Ar between each of said pulses. Each cycle included a $TEMAH/H_2O$ pulsing sequence followed by five $SiCl_4/H_2O$ pulsing sequences (i.e., Hf/Si pulse ratio was 1:5). The growth rate of the hafnium silicate film was about 0.95 Å/cycle.

The hafnium silicate film formed had a hafnium concentration of about 18%, a silicon concentration of about 15% and an oxygen concentration of about 66%. Carbon and chlorine impurity levels were less than about 1% (i.e., 10,000 ppm) and 0.2% (i.e., 2000 ppm), respectively, as determined by nuclear reaction analysis (NRA) and rutherford backscattering spectrometry (RBS). The hafnium silicate film had a step coverage of about 100%.

In at least some of the aforesaid embodiments, any element used in an embodiment can interchangeably be used in another embodiment unless such a replacement is not feasible.

It will be appreciated by those skilled in the art that various other omissions, additions and modifications may be made to the methods and structures described above without departing from the scope of the invention. All such modifications and changes are intended to fall within the scope of the invention, as defined by the appended claims.

We claim:

1. An atomic layer deposition (ALD) method for forming a metal silicate film, the method comprising alternately contacting a substrate in a reaction space with vapor phase pulses of an alkyl amide metal compound comprising hafnium or zirconium, a silicon halide compound and an oxidizing agent, wherein the metal in the metal silicate film consists of hafnium or hafnium and zirconium.

2. The method of claim 1, wherein the substrate is sequentially contacted with the alkyl amide metal compound, the oxidizing agent and the silicon halide compound.

3. The method of claim 1, wherein the substrate is sequentially contacted with the silicon halide compound, the oxidizing agent and the alkyl amide metal compound.

4. The method of claim 1, wherein the alkyl amide metal compound is selected from the group consisting of tetrakis(ethylmethylamino)metal, tetrakis(diethylamino)metal and tetrakis(dimethylamino)metal.

5. The method of claim 1, wherein the metal silicate film to be formed consists of hafnium (Hf) and zirconium (Zr).

6. The method of claim 1, wherein the silicon halide compound is silicon tetrachloride ($SiCl_4$).

7. The method of claim 1, wherein the oxidizing agent is selected from the group consisting of water, ozone and plasma-excited species of molecular oxygen ($O_2$).

8. The method of claim 1, further comprising purging the reaction space between each of said vapor phase pulses.

9. The method of claim 8, wherein the reaction space is purged with one or more gases selected from the group consisting of argon (Ar), nitrogen ($N_2$), helium (He) and hydrogen ($H_2$).

10. The method of claim 1, further comprising removing excess metal compound, silicon compound and oxidizing agent with the aid of a pumping system.

11. The method of claim 1, wherein the metal silicate film is formed at a substrate temperature between about 150° C. and 500° C.

12. The method of claim 11, wherein the metal silicate film is formed at a substrate temperature between about 250° C. and 350° C.

13. The method of claim 1, wherein the metal silicate film is used in a dynamic random access memory (DRAM) device.

14. The method of claim 1, wherein the metal silicate film is used as a gate dielectric in a complementary metal oxide semiconductor (CMOS) device.

15. The method of claim 1, wherein the metal silicate film is used as a component of a capacitor-based device.

16. The method of claim 1, wherein the alkyl amide metal compound comprises hafnium and zirconium.

17. The method of claim 1, wherein the metal silicate film has a carbon impurity concentration less than about 15,000 ppm, and wherein the metal silicate film has a halogen impurity concentration less than about 5,000 ppm.

18. An atomic layer deposition (ALD) process for forming a metal silicate film on a substrate in a reaction space, wherein the metal in the metal silicate film consists of hafnium or hafnium and zirconium, comprising:
(a) contacting the substrate with a vapor phase pulse of an alkyl amide metal comprising hafnium;
(b) removing excess alkyl amide metal compound and reaction by-products from the reaction space;
(c) contacting the substrate with a vapor phase pulse of a first oxidizing agent;
(d) removing excess first oxidizing agent and reaction by-products from the reaction space;
(e) contacting the substrate with a vapor phase pulse of a silicon halide compound;
(f) removing excess silicon halide compound and reaction by-products from the reaction space;
(g) contacting the substrate with a vapor phase pulse of a second oxidizing agent;
(h) removing excess second oxidizing agent and reaction by-products from the reaction space; and
(i) repeating steps (a) through (h) until the metal silicate film of a desired thickness is formed over the substrate.

19. The method of claim 18, wherein formation of the metal silicate film begins with step (a) or step (e).

20. The method of claim 18, wherein steps (a) through (d) are repeated a desired number of times prior to steps (e) through (h).

21. The method of claim 18, wherein steps (e) through (h) are repeated a desired number of times after steps (a) through (d).

22. The method of claim 18, wherein the first oxidizing agent is the same as the second oxidizing agent.

23. The method of claim 18, wherein the first and second oxidizing agents are selected from the group consisting of water, ozone and plasma-excited species of molecular oxygen ($O_2$).

24. The method of claim 18, wherein the first oxidizing agent comprises one of water, ozone and plasma-excited species of molecular oxygen ($O_2$), and the second oxidizing agent is different from the first oxidizing agent.

25. The method of claim 18, wherein removing comprises purging the reaction space with an inert gas and/or pumping the reaction space with the aid of a pumping system.

26. The method of claim 18, wherein steps (a)-(d) form a metal oxide selected from the group consisting of hafnium oxide and zirconium oxide.

27. The method of claim 18, wherein steps (e)-(h) form a silicon oxide selected from the group consisting of SiO and $SiO_2$.

28. The method of claim 18, wherein the metal silicate comprises hafnium and zirconium.

29. The method of claim 18, wherein step (a) comprises simultaneously contacting the substrate with a vapor phase pulse of an alkyl amide metal compound comprising hafnium and an alkyl amide metal compound comprising zirconium.

30. The method of claim 18, wherein the alkyl amide metal compound comprises hafnium and zirconium.

31. The method of claim 18, wherein the metal silicate film has a carbon impurity concentration less than about 15,000 ppm, and wherein the metal silicate film has a halogen impurity concentration less than about 5,000 ppm.

* * * * *